United States Patent
Jian et al.

(10) Patent No.: US 10,290,543 B1
(45) Date of Patent: May 14, 2019

(54) METHOD FOR MANUFACTURING SEMICONDUCTOR DEVICE

(71) Applicant: MACRONIX International Co., Ltd., Hsinchu (TW)

(72) Inventors: Chang-Wen Jian, New Taipei (TW); Hsiang-Lu Wu, Taoyuan (TW); Yu-Min Hung, Taichung (TW); Tzung-Ting Han, Hsinchu (TW)

(73) Assignee: MACRONXI International Co., Ltd., Hsinchu (TW)

( * ) Notice: Subject to any disclaimer, the term of this patent is extended or adjusted under 35 U.S.C. 154(b) by 0 days.

(21) Appl. No.: 15/848,986

(22) Filed: Dec. 20, 2017

(51) Int. Cl.
*H01L 49/02* (2006.01)
*H01L 21/768* (2006.01)
*H01L 21/3213* (2006.01)

(52) U.S. Cl.
CPC .. *H01L 21/76892* (2013.01); *H01L 21/32133* (2013.01); *H01L 28/40* (2013.01)

(58) Field of Classification Search
None
See application file for complete search history.

(56) References Cited

U.S. PATENT DOCUMENTS

| | | | |
|---|---|---|---|
| 6,607,988 B2 * | 8/2003 | Yunogami | C23F 4/00 257/E21.019 |
| 8,674,522 B1 | 3/2014 | Pratt et al. | |
| 2001/0006245 A1 * | 7/2001 | Yunogami | C23F 4/00 257/513 |
| 2012/0025402 A1 | 2/2012 | Bicksler | |
| 2013/0175695 A1 | 7/2013 | Bicksler | |
| 2013/0193398 A1 | 8/2013 | Pellizzer et al. | |
| 2014/0291604 A1 | 10/2014 | Pellizzer et al. | |

FOREIGN PATENT DOCUMENTS

| | | | |
|---|---|---|---|
| CN | 102751244 A | * | 10/2012 |
| CN | 102751244 B | * | 3/2014 |

* cited by examiner

*Primary Examiner* — Telly D Green
(74) *Attorney, Agent, or Firm* — J.C. Patents

(57) ABSTRACT

A method for manufacturing semiconductor device is provided. A substrate having a memory region and a capacitance region is provided. A plurality of word line structures are formed on the memory region of the substrate. A capacitance structure is formed on the capacitance region of the substrate. The word line structures and the capacitance structure each include a first dielectric layer on the substrate, a first conductive layer on the first dielectric layer, a second dielectric layer on the first conductive layer, and a second conductive layer on the second dielectric layer. The second conductive layers of the word line structures close to an edge of the memory region and a portion of the second conductive layer of the capacitance structure are removed at the same time to form a trench exposing a portion of the second dielectric layer.

16 Claims, 7 Drawing Sheets

METHOD FOR MANUFACTURING SEMICONDUCTOR DEVICE

BACKGROUND OF THE INVENTION

1. Field of the Invention

The invention relates to a method for manufacturing a semiconductor device.

2. Description of Related Art

As semiconductor manufacturing enters the nano-scale generation, line width is constantly being reduced. If the size of line width is less than the wavelength of an exposure source, an optical proximity effect (OPE) may be induced when light of the exposure source passes through a photomask. As a result, a difference between a patterned photoresist and a pattern on the photomask may occur. In semiconductor manufacturing, when a patterned photoresist is adopted to define word line structures, the optical proximity effect may result in a greater width at a portion of the word line structure close to an edge of a memory region than a width of the word line structure elsewhere in each word line structure.

Since the width of the word line structure close to the edge of the memory region is greater, the adjacent word line structures may be close to or even connected with each other. Consequently, the word line structures may interfere with each other or even result in a word line bridge and cause a short circuit. In a known manufacturing process, before or after manufacturing of other devices, such as before manufacturing of a capacitance structure, a patterning process is performed on the word line structure close to the edge of the memory region by using an additional photomask to remove the portion of the word line structure with a greater width. However, the additional etching process may result in an increase in the manufacturing costs and the manufacturing processes.

SUMMARY OF THE INVENTION

One or some embodiments of the invention provide a method for manufacturing a semiconductor device capable of preventing adjacent word line structures from interfering with each other and resulting a short circuit. Accordingly, the manufacturing cost and the manufacturing processes may be reduced.

A method for manufacturing a semiconductor device includes steps as follows. A substrate having a memory region and a capacitance region is provided. A plurality of word line structures are formed on the memory region of the substrate. A capacitance structure is forming on the capacitance region of the substrate. The word line structures and the capacitance structure each include a first dielectric layer on the substrate, a first conductive layer on the first dielectric layer, a second dielectric layer on the first conductive layer, and a second conductive layer on the second dielectric layer. The second conductive layers of the word line structures close to an edge of the memory region and a portion of the second conductive layer of the capacitance structure are removed at the same time to form a trench exposing a portion of the second dielectric layer.

A method for manufacturing a semiconductor device includes steps as follows. A substrate having a memory region and a capacitance region is provided. Isolation structures are formed in the substrate to define active areas. A first dielectric layer is formed on the substrate in the active areas. A first conductive layer is forming on the first dielectric layer. A second dielectric layer is forming on the substrate. A second conductive layer is formed on the second dielectric layer. A portion of the first dielectric layer, a portion of the first conductive layer, a portion of the second dielectric layer and a portion of the second conductive layer in the memory region and the capacitance region are removed by performing a patterning process to form a plurality of word line structures in the memory region and form a capacitance structure in the capacitance region. An extending direction of the word line structures intersects an extending direction of the isolation structures. The second conductive layers of the word line structures close to an edge of the memory region and a portion of the second conductive layer of the capacitance structure are removed at the same time to form a trench exposing a portion of the second dielectric layer.

According to an embodiment of the invention, the first dielectric layer includes an oxide layer, for example.

According to an embodiment of the invention, the first conductive layer includes a polysilicon layer, for example.

According to an embodiment of the invention, the second dielectric layer includes a composite layer including an oxide layer, a nitride layer, and an oxide layer stacked in sequence, for example.

According to an embodiment of the invention, the second conductive layer includes a polysilicon layer, for example.

According to an embodiment of the invention, the second conductive layers of the word line structures close to the edge of the memory region and the portion of the second conductive layer of the capacitance structure are removed in the same etching process.

According to an embodiment of the invention, in each of the word line structures, a width of a portion of the word line structure close to the edge of the memory region is greater than a width of the word line structure elsewhere.

According to an embodiment of the invention, in adjacent word line structures of the word line structures, the second conductive layers in the portions close to the edge of the memory region are connected with each other.

Based on the above, the method for manufacturing the semiconductor device according to one or some embodiments of the invention are able to prevent the adjacent word line structures from being too close to each other or even forming a bridge, so as to prevent the adjacent word line structures from interfering with each other or causing a short circuit. In addition, by combining a photomask for removing the second conductive layers close to the edge of the memory region and a photomask for forming the capacitance structure into one photomask, the manufacturing cost and the manufacturing process are reduced.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
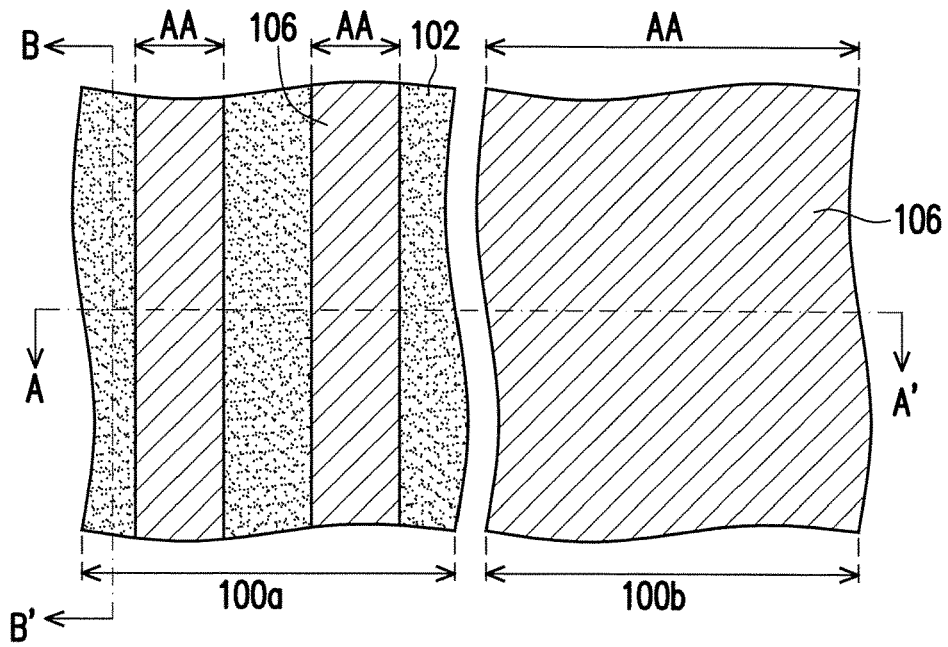
FIGS. 1A to 1D are schematic top views illustrating a method for manufacturing a semiconductor device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1D are schematic top views illustrating a method for manufacturing a semiconductor device according to an embodiment of the invention. FIGS. 2A to 2D are respectively schematic cross-sectional views along a line A-A' of FIGS. 1A to 1D. FIGS. 3A to 3D are respectively schematic cross-sectional views along a line B-B' of FIGS. 1A to 1D.

Figure 2A:
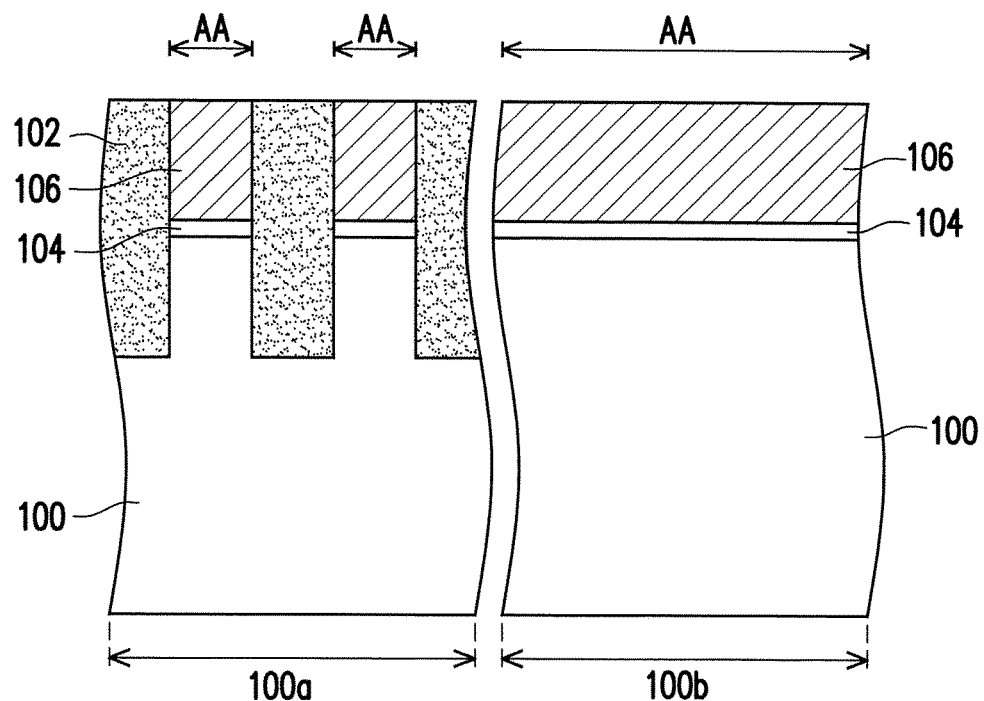
FIGS. 2A to 2D are respectively schematic cross-sectional views along a line A-A' of FIGS. 1A to 1D.
Figure 3A:
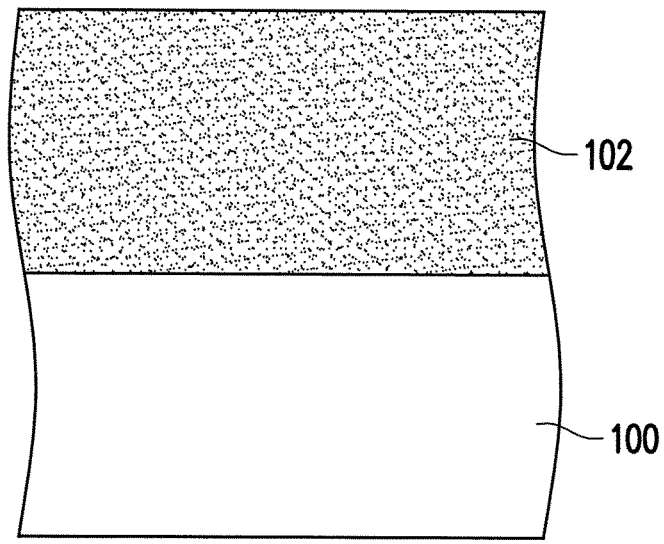
FIGS. 3A to 3D are respectively schematic cross-sectional views along a line B-B' of FIGS. 1A to 1D.

Referring to FIGS. 1A, 2A, and 3A, a substrate 100 is provided. The substrate 100 is a silicon substrate, for example. In addition, the substrate 100 has a memory region 100a and a capacitance region 100b. Then, bar-shaped isolation structures 102 are formed in the substrate 100 to define active areas AA. The isolation structures 102 are shallow trench isolation (STI) structures, for example. Then, a first dielectric layer 104 is formed on the substrate 100 in the active areas AA. The first dielectric layer 104 includes an oxide layer, for example, and is formed by performing a thermal oxidation process, for example.

Next, a first conductive layer 106 is formed on the first dielectric layer 104. The first conductive layer 106 includes a polysilicon layer, for example, and is formed by forming a conductive material layer (not shown) covering the isolation structures 102 by performing a chemical vapor deposition (CVD) process on the substrate 100 and then performing a planarization process on the conductive material layer until a top surface of the isolation structures 102 is exposed, for example.

Figure 1B:
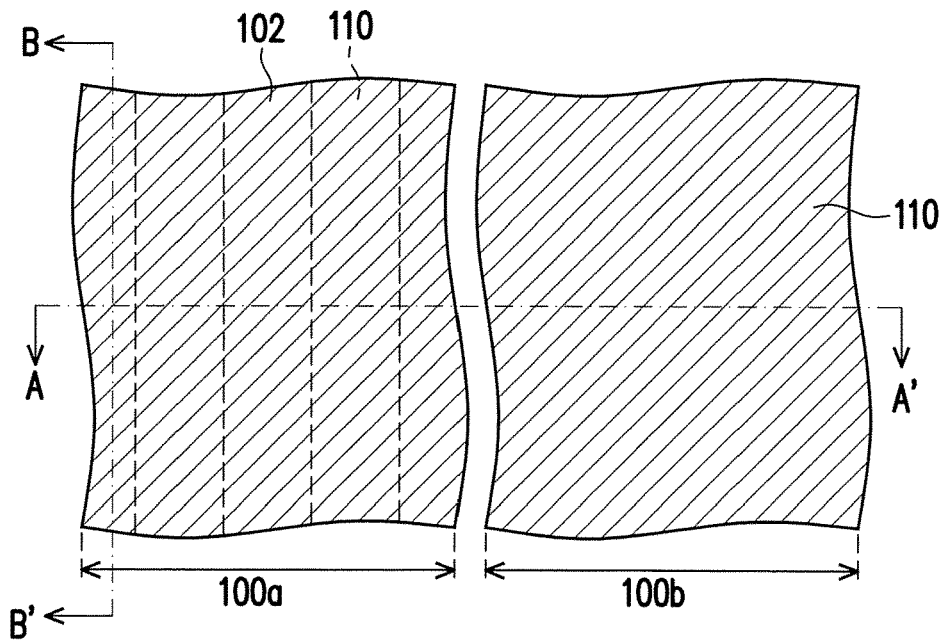
Figure 2B:
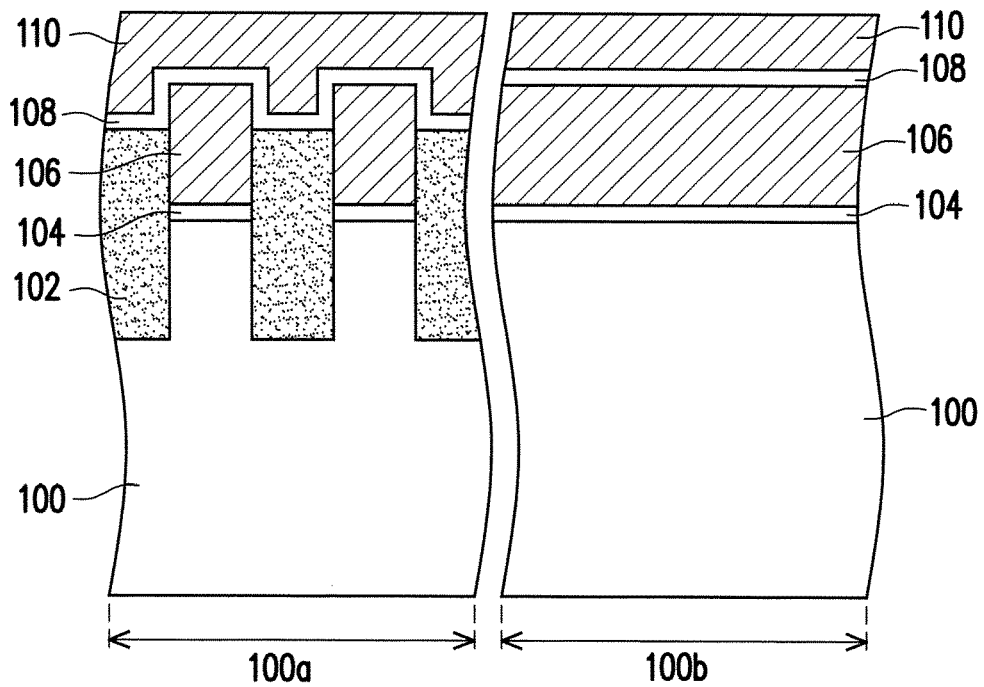
Figure 3B:
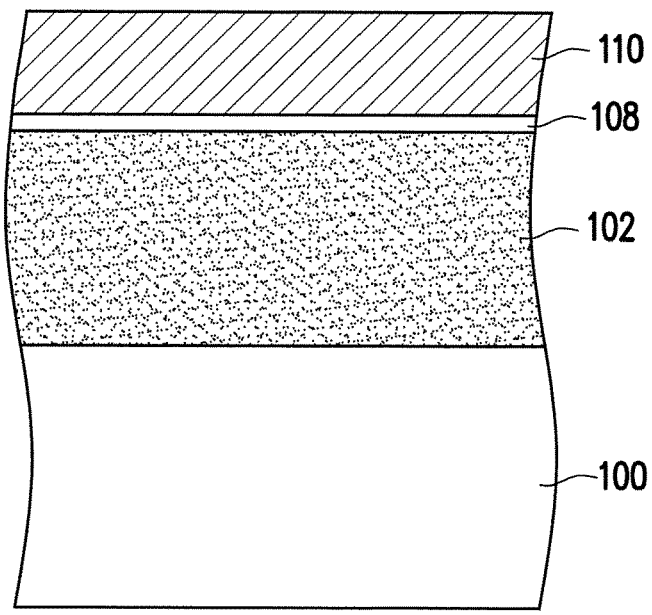

Then, referring to FIGS. 1B, 2B, and 3B, an etch-back process is selectively performed on the isolation structures 102 to remove a portion of the isolation structure 102. Accordingly, the top surface of the isolation structures 102 is lower than a top surface of the first conductive layer 106. Then, a second dielectric layer 108 is conformally formed on the substrate 100. In the embodiment, the second dielectric layer 108 is formed by sequentially forming an oxide layer, a nitride layer, and an oxide layer on the substrate 100 by performing a chemical vapor deposition process. Nevertheless, in another embodiment, the second dielectric layer 108 may include a single oxide layer. Then, a second conductive layer 110 is formed on the second dielectric layer 108. The second conductive layer 110 includes a polysilicon layer, for example, and is formed by performing a chemical vapor deposition process, for example.

Figure 1C:
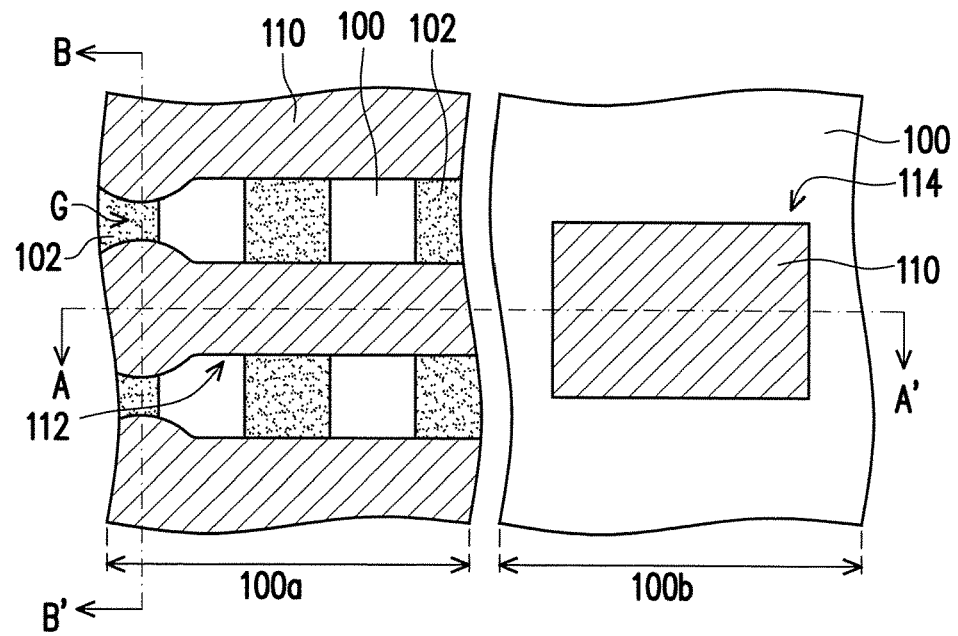
Figure 2C:
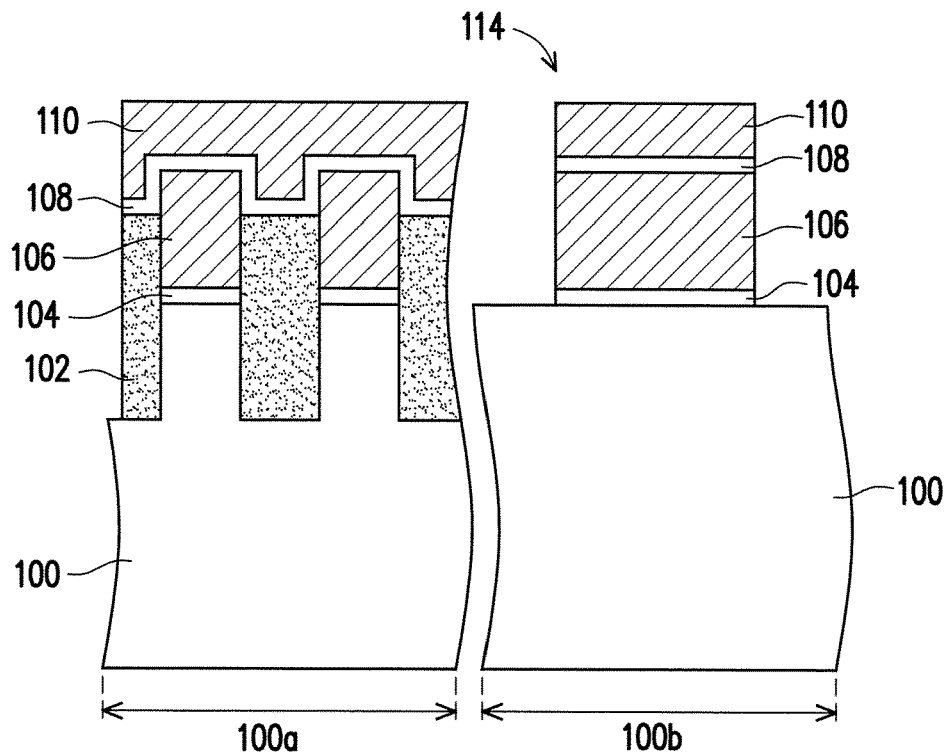
Figure 3C:
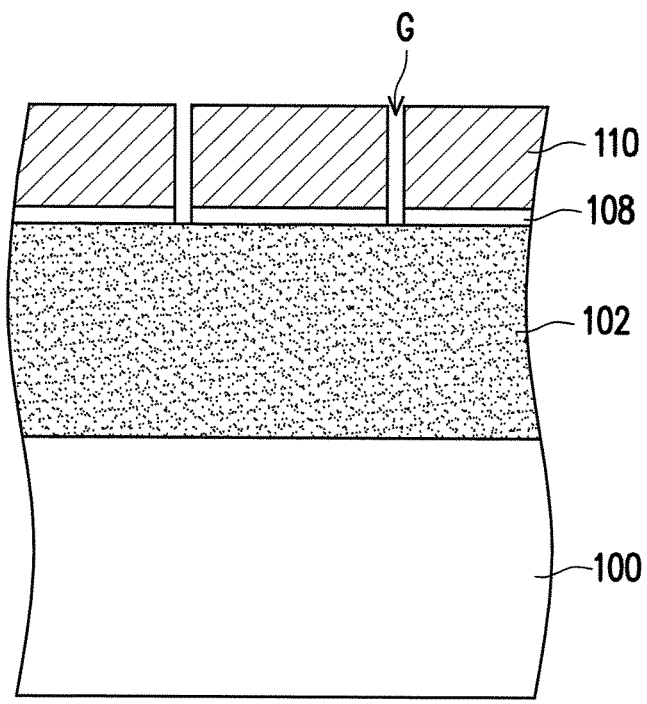

Then, referring to FIGS. 1C, 2C, and 3C, a portion of the first dielectric layer 104, a portion of the first conductive layer 106, a portion of the second dielectric layer 108, and a portion of the second conductive layer 110 in the memory region 100a and the capacitance region 100b are removed by performing a patterning process, so as to form a plurality of word line structures 112 in the memory region 100a and form a capacitance structure 114 in the capacitance region 110b. In addition, an extending direction of the word line structures 112 intersects an extending direction of each of the isolation structures 102.

Figure 4:
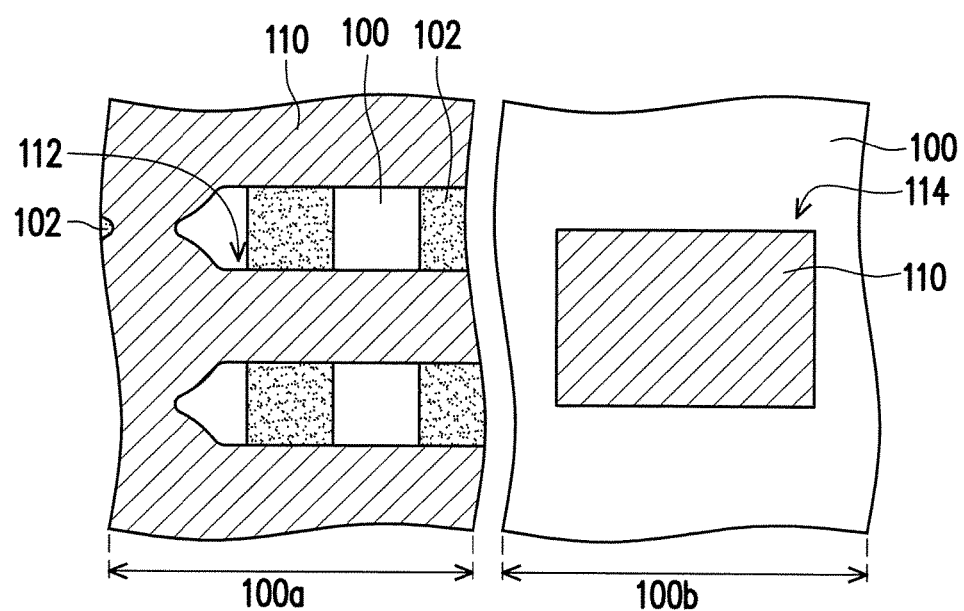
FIG. 4 is a schematic top view illustrating a method for manufacturing a semiconductor device according to another embodiment of the invention.

Besides, due to the optical proximity effect, in each of the word line structures 112 formed after the patterning process is performed, a width of a portion (end portion) of the word line structure 112 near an edge of the memory region 100a is greater than a width of the word line structure 112 elsewhere. In the embodiment, after the patterning process, a gap G is provided between the portions (end portions) of the adjacent word line structures 112 close to the edge of the memory region 100a, and the gap G exposes a portion of the isolation structure 102. When a width of the gap G (a distance between the portions of the adjacent word line structures 112 close to the edge of the memory region 100a) is too small, the adjacent word line structures 112 may interfere with each other. Particularly, when the width of the gap G is zero, i.e., when the portions of the adjacent word line structures 112 close to the edge of the memory region 100a are connected with each other, a short circuit may occur, as shown in FIG. 4.

Figure 1D:
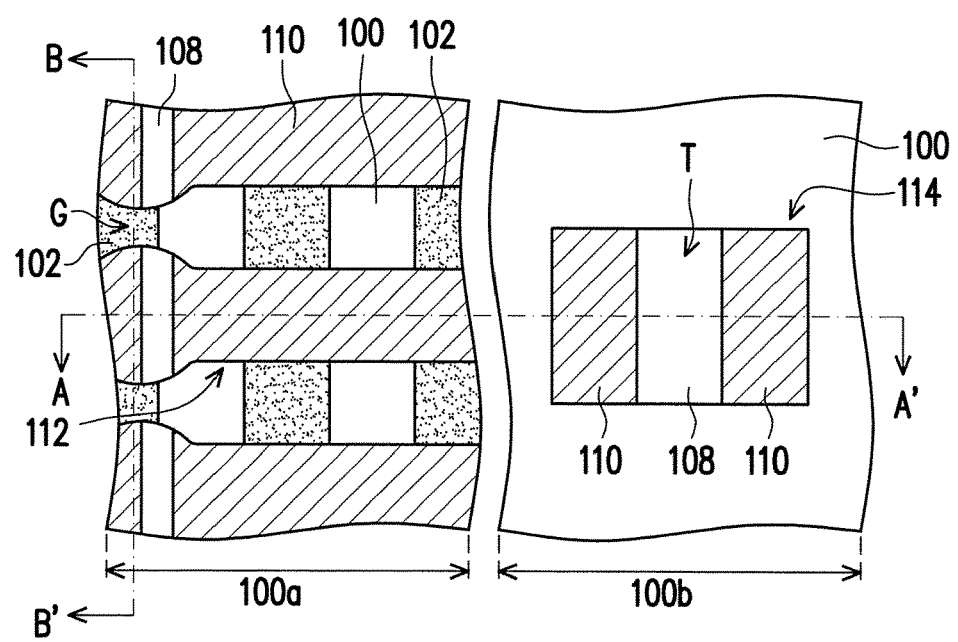
Figure 2D:
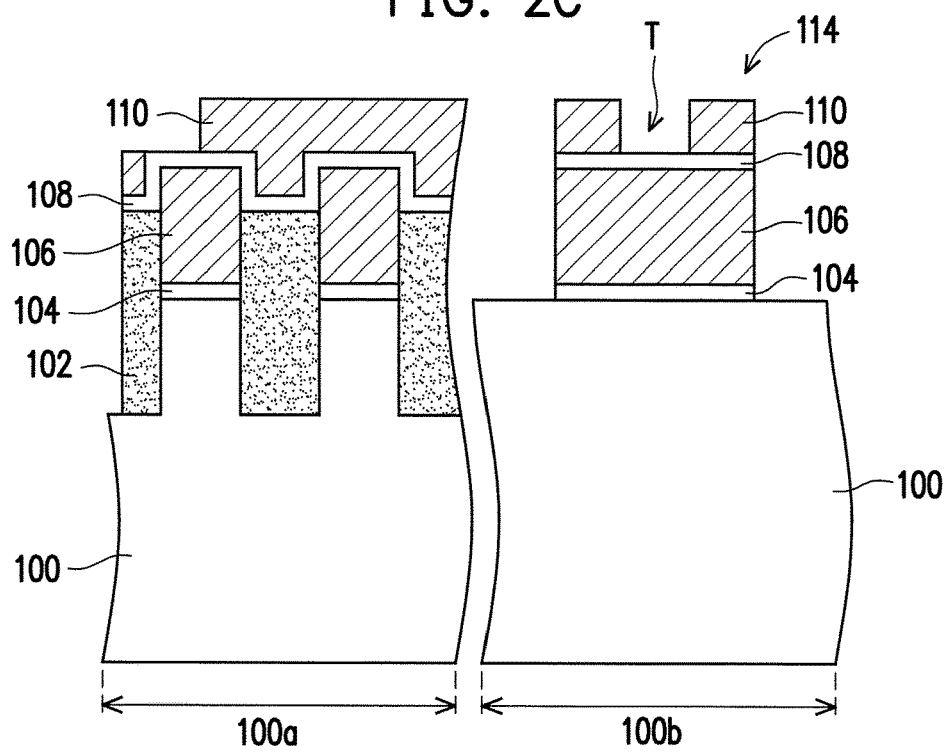
Figure 3D:
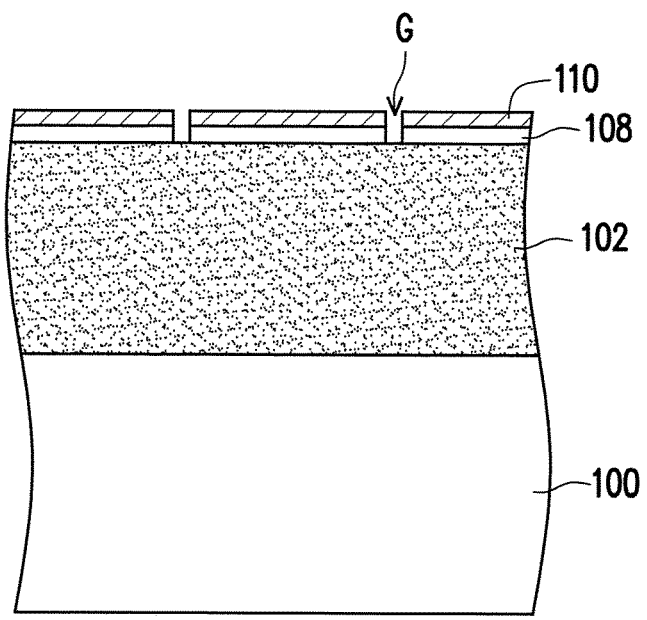

Then, referring to FIGS. 1D, 2D, and 3D, an etching process is performed on a portion of the word line structures 112 and a portion of the capacitance structure 114 to remove the second conductive layers 110 of the word line structures 112 close to the edge of the memory region 110 and remove a portion of the second conductive layer 110 of the capacitance structure 114 at the same time to form a trench T exposing a portion of the second dielectric layer 108 in the second conductive layer 110 of the capacitance structure 114. Specifically, the etching process may be performed to remove the second conductive layer 110 close to the edge of the memory region 110 until the second dielectric layer 108 is exposed. After the etching process, a top surface of the second conductive layer 110 on the isolation structure 102 close to the edge of the memory region 100a may be coplanar with a top surface of the second dielectric layer 108. As a result, in each of the word line structures 112, the second conductive layer 110 on the isolation structure 102 close to the edge of the memory region 100a is electrically isolated from the second conductive layer 110 elsewhere. Therefore, even if the width of the gap G is too small, the adjacent word line structures 112 do not interfere with each other or cause a short circuit.

In addition, when the etching process is performed on a portion of the word line structures 112, a portion of the capacitance structure 114 is also etched at the same time to form the trench T exposing a portion of the second dielectric layer 108 in the capacitance structure 114. Therefore, it does not require different photomasks to respectively manufacture the trench T and remove the ends of the word line structures 112. Therefore, the manufacturing cost and the manufacturing processes are reduced. Besides, forming the trench T exposing a portion of the second dielectric layer 108 in the capacitance structure 114 allows the capacitance structure 114 to store charges. After performing the etching process on the word line structures 112 and the capacitance structure 114, the semiconductor device according to the embodiment of the invention is completed.

In another embodiment, when the etching process is performed, an etching time may be properly extended to remove the whole second conductive layers 110 close to the edge of the memory region 100a in the word line structures 112. In the step of FIG. 1C, since the second conductive layers 110 adjacent to or even connected with each other and close to the edge of the memory region 100a are completely removed, the adjacent word line structures 112 do not interfere with each other or form a bridge.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a semiconductor device, comprising:
   providing a substrate having a memory region and a capacitance region;
   forming a plurality of word line structures on the memory region of the substrate and a capacitance structure on the capacitance region of the substrate, wherein the word line structures and the capacitance structure each comprise:
   a first dielectric layer, located on the substrate;
   a first conductive layer, located on the first dielectric layer;
   a second dielectric layer, located on the first conductive layer; and
   a second conductive layer, located on the second dielectric layer;
   removing the second conductive layers of the word line structures close to an edge of the memory region and removing a portion of the second conductive layer of the capacitance structure at the same time to form a trench exposing a portion of the second dielectric layer in the second conductive layer of the capacitance structure.

2. The method as claimed in claim 1, wherein the first dielectric layer comprises an oxide layer.

3. The method as claimed in claim 1, wherein the first conductive layer comprises a polysilicone layer.

4. The method as claimed in claim 1, wherein the second dielectric layer comprises a composite layer comprising an oxide layer, a nitride layer, and an oxide layer stacked in sequence.

5. The method as claimed in claim 1, wherein the second conductive layer comprises a polysilicone layer.

6. The method as claimed in claim 1, wherein the second conductive layers of the word line structures close to the edge of the memory region and the portion of the second conductive layer of the capacitance structure are removed in the same etching process.

7. The method as claimed in claim 1, wherein in each of the word line structures, a width of a portion of the word line structure close to the edge of the memory region is greater than a width of the word line structure elsewhere.

8. The method as claimed in claim 7, wherein in adjacent word line structures of the word line structures, the second conductive layers in the portions close to the edge of the memory region are not connected with each other.

9. A method for manufacturing a semiconductor device, comprising:
   providing a substrate having a memory region and a capacitance region;
   forming isolation structures in the substrate to define active areas;
   forming a first dielectric layer on the substrate in the active areas;
   forming a first conductive layer on the first dielectric layer;
   forming a second dielectric layer is formed on the substrate;
   forming a second conductive layer on the second dielectric layer;
   removing a portion of the first dielectric layer, a portion of the first conductive layer, a portion of the second dielectric layer and a portion of the second conductive layer in the memory region and the capacitance region by performing a patterning process to form a plurality of word line structures in the memory region and form a capacitance structure in the capacitance region, wherein an extending direction of the word line structures intersects an extending direction of the isolation structures; and
   removing the second conductive layers of the word line structures close to an edge of the memory region and removing a portion of the second conductive layer of the capacitance structure at the same time to form a trench exposing a portion of the second dielectric layer in the second conductive layer of the capacitance structure.

10. The method as claimed in claim 9, wherein the first dielectric layer comprises an oxide layer.

11. The method as claimed in claim 9, wherein the first conductive layer comprises a polysilicone layer.

12. The method as claimed in claim 9, wherein the second dielectric layer comprises a composite layer comprising an oxide layer, a nitride layer, and an oxide layer stacked in sequence.

13. The method as claimed in claim 9, wherein the second conductive layer comprises a polysilicone layer.

14. The method as claimed in claim 9, wherein the second conductive layers of the word line structures close to the edge of the memory region and the portion of the second conductive layer of the capacitance structure are removed in the same etching process.

15. The method as claimed in claim 9, wherein in each of the word line structures, a width of a portion of the word line structure close to the edge of the memory region is greater than a width of the word line structure elsewhere.

16. The method as claimed in claim 15, wherein in adjacent word line structures of the word line structures, the second conductive layers in the portions close to the edge of the memory region are not connected with each other.

* * * * *